(12) United States Patent
Xu et al.

(10) Patent No.: US 11,592,495 B2
(45) Date of Patent: Feb. 28, 2023

(54) TEST SYSTEM, TRANSMITTER, AND RECEIVER CAPABLE OF EXECUTING MULTIPLE TESTS BASED ON DC COUPLING CONFIGURATION

(71) Applicant: REALTEK SEMICONDUCTOR CORPORATION, Hsinchu (TW)

(72) Inventors: Fei Xu, Suzhou (CN); Wei-Xiong He, Suzhou (CN); Feng-Cheng Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 208 days.

(21) Appl. No.: 17/067,821

(22) Filed: Oct. 12, 2020

(65) Prior Publication Data

US 2021/0116515 A1 Apr. 22, 2021

(30) Foreign Application Priority Data

Oct. 21, 2019 (CN) .......................... 201911002398.1

(51) Int. Cl.
*G01R 31/52* (2020.01)
*G01R 19/165* (2006.01)
*G01R 19/10* (2006.01)

(52) U.S. Cl.
CPC ............. *G01R 31/52* (2020.01); *G01R 19/10* (2013.01); *G01R 19/16566* (2013.01)

(58) Field of Classification Search
CPC .. G01R 31/52; G01R 19/10; G01R 19/16566; G01R 31/2822; G01R 1/28; G01R 1/30
See application file for complete search history.

(56) References Cited

U.S. PATENT DOCUMENTS

| 5,457,391 A * | 10/1995 | Shimizu | G01R 31/42 324/210 |
| 2012/0081138 A1* | 4/2012 | Sul | G01R 31/31716 324/750.3 |

(Continued)

FOREIGN PATENT DOCUMENTS

JP 2009130680 A * 6/2009

OTHER PUBLICATIONS

Signal integrity—Is TMDS really differential_—Electrical Engineering Stack Exchange, Mar. 18, 2015/Jul. 30, 2018/Jan. 13, 2017, Electrical Engineering.

*Primary Examiner* — Feba Pothen
(74) *Attorney, Agent, or Firm* — WPAT, PC

(57) ABSTRACT

Disclosed is a test system including a transmitter, a receiver, a measuring circuit, and a control circuit. The transmitter is coupled to the receiver in a DC coupling manner, and includes: a signal input circuit determining an output signal according to an input signal; a current source coupled between the signal input circuit and a low power-supply terminal and configured to determine a total current passing through the signal input circuit in a non-open/short-circuited condition; and a signal output wire circuit outputting the output signal for a performance test. The receiver includes: an impedance circuit coupled to the signal output wire circuit; and a coupling circuit coupling the impedance circuit with a high power-supply terminal. The measuring circuit measures a target current/voltage between the high power-supply terminal and low power-supply terminal to generate a measurement result. The control circuit determines whether the transmitter/receiver is open/short-circuited according to the measurement result.

20 Claims, 12 Drawing Sheets

(56) References Cited

U.S. PATENT DOCUMENTS

2016/0216317 A1* 7/2016 Chen .................. H04B 17/29
2021/0135708 A1* 5/2021 Yamamoto ............ G01R 31/52

* cited by examiner

TEST SYSTEM, TRANSMITTER, AND RECEIVER CAPABLE OF EXECUTING MULTIPLE TESTS BASED ON DC COUPLING CONFIGURATION

BACKGROUND OF THE INVENTION

1. Field of the Invention

The present invention relates to a test system, a transmitter, and a receiver capable of executing multiple tests, especially to a test system, a transmitter, and a receiver capable of executing multiple tests based on a direct-current (DC) coupling configuration.

2. Description of Related Art

High-speed signal transmission is usually based on a direct-current (DC) coupling configuration or an alternating-current (AC) coupling configuration. In a DC coupling configuration, a transmitter and a receiver are coupled directly without any intervening capacitor; therefore, not only a DC signal but also an AC signal can successfully be transmitted from any of the transmitter and receiver to the other. Protocols that are based on a DC coupling configuration include High Definition Multimedia Interface (HDMI) protocol.

FIG. 1 shows a conventional test system for testing a transmitter based on a DC coupling configuration. The test system 100 of FIG. 1 includes a device under test (DUT) 110 (i.e., a transmitter), a multiplexer 120, a performance test unit 130 (i.e., a receiver), and a gauge 140 for detecting open-circuited and short-circuited problems. In order to let the test system 100 test the transmission function of the DUT 110, the multiplexer 120 electrically connects the DUT 110 with the performance test unit 130; and in order to let the test system 100 find out whether the DUT 110 has any open-circuited/short-circuited problem, the multiplexer 120 electrically connects the DUT 110 with the gauge 140.

FIG. 2 shows another conventional test system for testing a receiver based on a DC coupling configuration. The test system 200 of FIG. 2 includes a DUT 210 (i.e., a receiver), a multiplexer 220, a signal generator 230 (i.e., a transmitter), and a gauge 240 for detecting open-circuited and short-circuited problems. In order to let the test system 200 test the reception function of the DUT 210, the multiplexer 220 electrically connects the DUT 210 with the signal generator 230; and in order to let the test system 200 find out whether the DUT 210 has any open-circuited/short-circuited problem, the multiplexer 220 electrically connects the DUT 210 with the gauge 240.

In light of the above, a conventional test system based on a DC coupling configuration needs a multiplexer to execute multiple tests (e.g., a test for testing transmission/reception function and a test for detecting open-circuited/short-circuited problems). However, the conventional test system has the following problems:
(1) The speed of signal transmission increases as the technology develops, and it is more and more difficult to find a qualified multiplexer.
(2) The multiplexer itself causes unwanted signal loss or reflection, and this degrades a test environment and decreases a product yield.

It should be noted that if the multiplexer is removed from the aforementioned test system, the test system 100 of FIG. 1 will be divided into two systems for performing the transmission function test and the open-circuited/short-circuited test respectively, and the test system 200 of FIG. 2 will be divided into two systems for performing the reception function test and the open-circuited/short-circuited test respectively. Consequently, numerous systems will be required for all tests and the overall time for the tests will get longer, and this is disadvantageous to the test cost.

SUMMARY OF THE INVENTION

An object of the present disclosure is to provide a test system, a transmitter, and a receiver, each of which can execute multiple tests based on a direct-current (DC) coupling configuration. The system, transmitter, and receiver have improvements over the prior art.

An embodiment of the test system of the present disclosure includes a transmitter, a receiver, a measuring circuit, and a control circuit. The transmitter includes: a signal input circuit configured to determine an output signal according to an input signal; a current source coupled between a low voltage terminal of the signal input circuit and a low power-supply terminal, and configured to determine a total current passing through the signal input circuit in a normal condition without any detected open-circuited problem and any detected short-circuited problem; and a signal output wire circuit coupled between a high voltage terminal of the signal input circuit and an impedance circuit, and configured to output the output signal that is a to-be-tested signal during a performance test, in which a voltage at the high voltage terminal is higher than a voltage at the low voltage terminal. The receiver is coupled to the transmitter in a DC coupling manner, and includes: the aforementioned impedance circuit coupled to a high power-supply terminal directly/indirectly, in which an impedance of the impedance circuit and the aforementioned total current jointly determine the strength of the output signal in the normal condition and a voltage at the high power-supply terminal is higher than a voltage at the low power-supply terminal. The measuring circuit is configured to measure a target current/voltage between the second power-supply terminal and the first power-supply terminal and thereby generate a measurement result. The control circuit is configured to determine whether a device under test (DUT) is in the normal condition according to the measurement result during a function test that is used for detecting open-circuited and short-circuited problems, in which the DUT is one of the transmitter and the receiver.

An embodiment of the transmitter of the present disclosure includes a differential signal input circuit, a current source, and a differential signal output wire circuit. The differential signal input circuit includes a first transistor and a second transistor. The first transistor is configured to determine a second output signal of a differential output signal according to a first input signal of a differential input signal; and the second transistor is configured to determine a first output signal of the differential output signal according to a second input signal of the differential input signal, in which a voltage level of the first input signal is different from a voltage level of the second input signal during a function test that is used for detecting open-circuited and short-circuited problems. The current source is coupled between a first voltage terminal of the differential signal input circuit and a first power-supply terminal, and configured to determine a total current passing through the differential signal input circuit in a normal condition without any detected open-circuited problem and any detected short-circuited problem. The differential signal output wire circuit is coupled with high voltage terminals of the first transistor and the second transistor, and configured to output the differential output signal that is a to-be-tested signal during a performance test, wherein during the function test, the voltage level of the first input signal and the voltage level of the second input signal are respectively dependent on a state of a second switch and a state of a first switch, the state of the second switch allows or forbids the total current to pass through the first transistor, the state of the first switch allows or forbids the total current to pass through the second transistor, and the state of the first switch is different from the state of the second switch.

An embodiment of the receiver of the present disclosure includes an impedance circuit and a switch circuit. The impedance circuit includes a first impedance and a second impedance. The first impedance is coupled to a first output terminal used for outputting a first output signal of a differential output signal, in which the first output signal of the differential output signal is dependent on a second input signal of a differential input signal. The second impedance is coupled to a second output terminal used for outputting a second output signal of the differential output signal, wherein the second output signal of the differential output signal is dependent on a first input signal of the differential input signal. The impedance circuit is configured to determine the strength of the differential output signal according to a total current in a normal condition without any detected open-circuited problem and any detected short-circuited problem, and the differential output signal is a to-be-tested signal during a performance test. The switch circuit is configured to couple the impedance circuit to a high power-supply terminal or couple a differential signal output terminal to the impedance circuit, and includes a first switch and a second switch; the differential signal output terminal includes the first output terminal and the second output terminal; the first switch is coupled between the power-supply terminal and the first impedance or coupled between the first impedance and the first output terminal; and the second switch is coupled between the power-supply terminal and the second impedance or coupled between the second impedance and the second output terminal, wherein during a function test used for detecting open-circuited and short-circuited problems, the voltage level of the first input signal and the voltage level of the second input signal relate to a state of the second switch and a state of the first switch respectively, and the state of the first switch is different from the state of the second switch.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure discloses a test system, a transmitter, and a receiver capable of executing multiple tests based on a direct-current (DC) coupling configuration.

Figure 3:
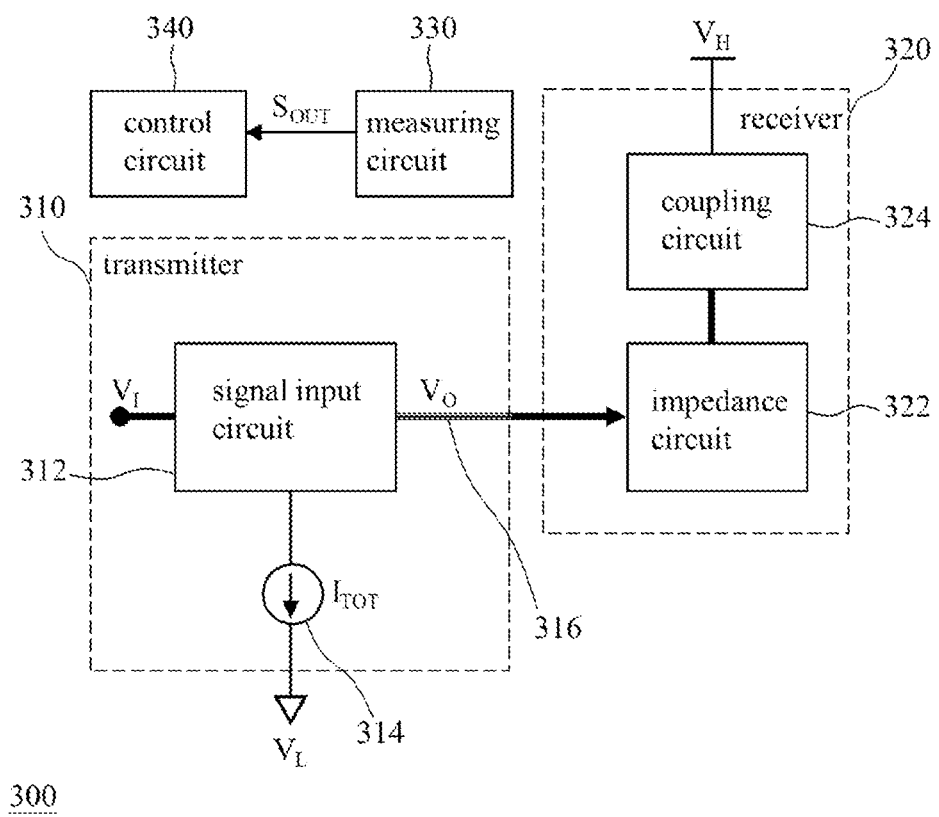
FIG. 3 shows an embodiment of the test system of the present disclosure.

FIG. 3 shows an embodiment of the test system of the present disclosure. The test system 300 of FIG. 3 includes a transmitter 310 (e.g., an HDMI transmitter), a receiver 320 (e.g., an HDMI receiver), a measuring circuit 330, and a control circuit 340. The transmitter 310 and the receiver 320 are coupled to each other in a DC coupling manner without any intervening multiplexer; in other words, there is no multiplexer set between the transmitter 310 and the receiver 320. The test system 300 is feasible for a single-ended signal or a differential signal. For a better understanding, some exemplary implementations (e.g., FIGS. 4-10) as mentioned in the later paragraphs use a differential signal for a test; however, those having ordinary skill in the art can appreciate how to use a single-ended signal for a test with the test system 300 by referring to the present disclosure and the common knowledge in this technical field.

Figure 1:
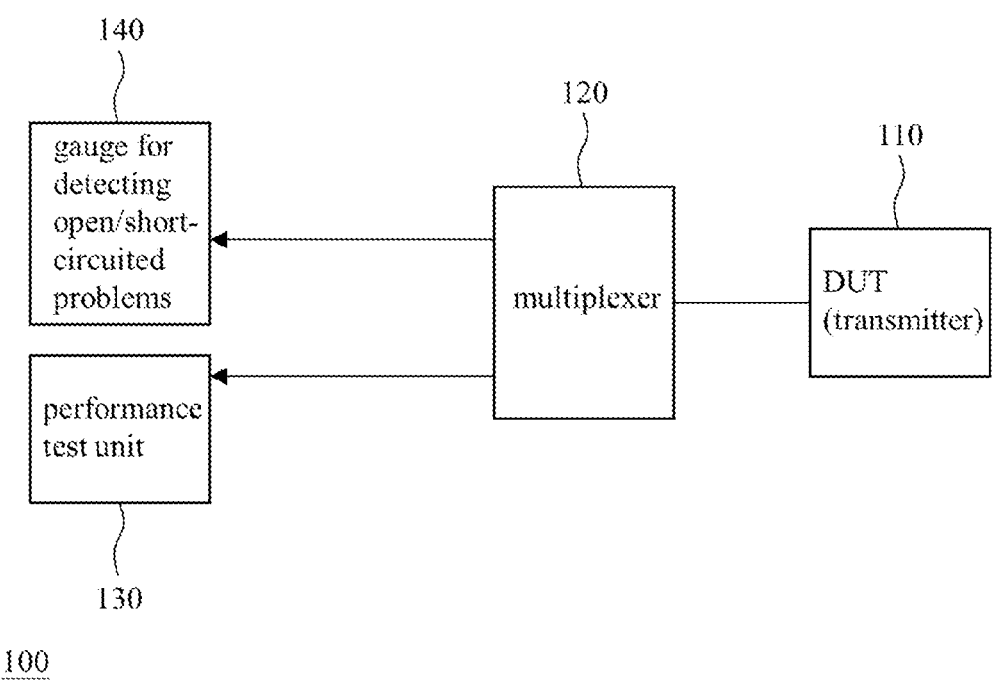
FIG. 1 shows a conventional test system for testing a transmitter.
Figure 2:
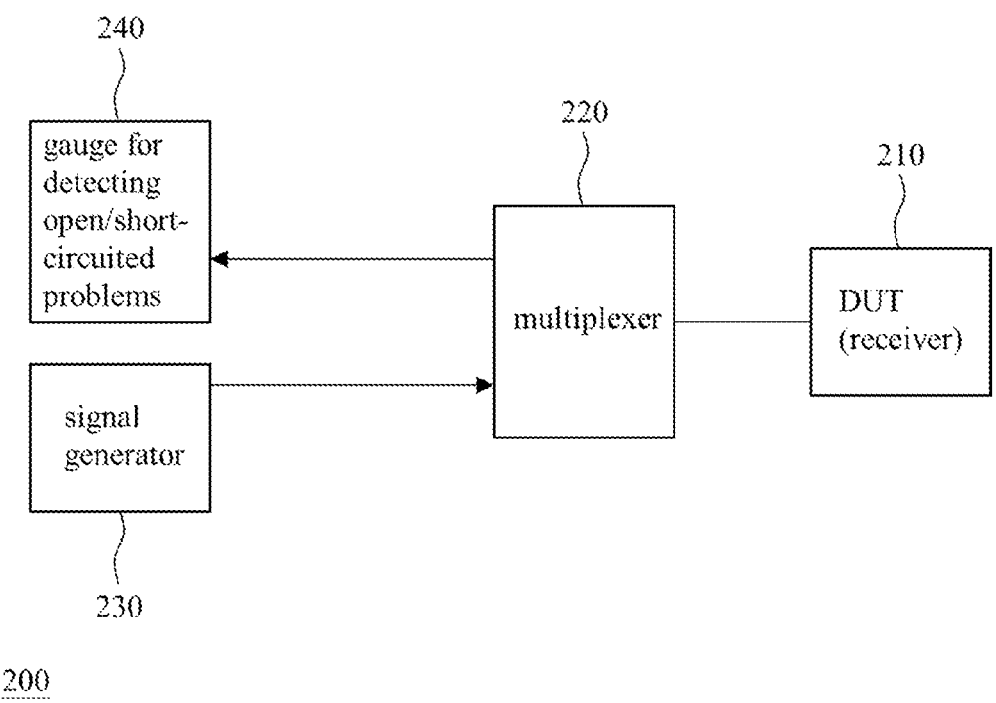
FIG. 2 shows a conventional test system for testing a receiver.

Please refer to FIG. 3. The transmitter 310 includes a signal input circuit 312, a current source 314, and a signal output wire circuit 316 (e.g., one or more transmission line(s)). The signal input circuit 312 is configured to determine an output signal $V_O$ according to an input signal $V_I$. The current source 314 is coupled between a low voltage terminal of the signal input circuit 312 and a low power-supply terminal $V_L$ (e.g., a ground terminal), and configured to determine a total current $I_{TOT}$ passing through the signal input circuit 312 in a normal condition without any detected open-circuited problem and any detected short-circuited problem. The signal output wire circuit 316 is coupled between a high voltage terminal of the signal input circuit 312 and an impedance circuit 322 and configured to output the output signal $V_O$, wherein the voltage at the high voltage terminal is higher than the voltage at the low voltage terminal, the output signal $V_O$ is a to-be-tested signal received by a receiving circuit (e.g., the performance test unit 130 of FIG. 1) during a performance test, and the performance test is a known or self-developed test. The receiver 320 includes the impedance circuit 322 and a coupling circuit 324. The impedance of the impedance circuit 322 and the total current $I_{TOT}$ jointly determine the strength of the output signal $V_O$ in the normal condition. The coupling circuit 324 is configured to couple the impedance circuit 322 to a high power-supply terminal $V_H$ (e.g., a 3.3V power-supply terminal) The measuring circuit 330 is coupled to two nodes between the high power-supply terminal $V_H$ and the lower power-supply terminal $V_L$ (e.g., a node between the terminal $V_H$ and the current meter 510 and another node between the current meter 510 and the terminal $V_L$ in FIG. 5) to measure a target current, which relates to the total current $I_{TOT}$, between the two nodes; or the measuring circuit 330 is coupled to at least a node between the high power-supply terminal $V_H$ and the low power-supply terminal $V_L$ (e.g., FIG. 9) to measure a target voltage, which relates to the total current $I_{TOT}$ and the impedance of the impedance circuit 322, at the node; consequently, the measuring circuit 330 generates a measurement result $S_{OUT}$. The control circuit 340 is configured to determine whether a device under test (DUT) is in a normal condition according to the measurement result $S_{OUT}$ during a function test that is used for detecting open-circuited and short-circuited problems, wherein the DUT can be any of the transmitter 310 and the receiver 320. The control circuit 340 can optionally be coupled to the transmitter 310 and/or receiver 320 (e.g., FIG. 4) in accordance with the demand for implementation. It should be noted that since the total current $I_{TOT}$ can be estimated in advance, the control circuit 340 can determine whether the measurement result $S_{OUT}$ meets one or multiple predetermined requirement(s) (e.g., the relation between $I_S$ and $I_{OUT}$ as shown in Table 1 or between $V_S$ and $V_{OK}$ as shown in Table 2 in the later paragraphs) according to the total current $I_{TOT}$ and thereby find out whether the DUT is in the normal condition.

Figure 4:
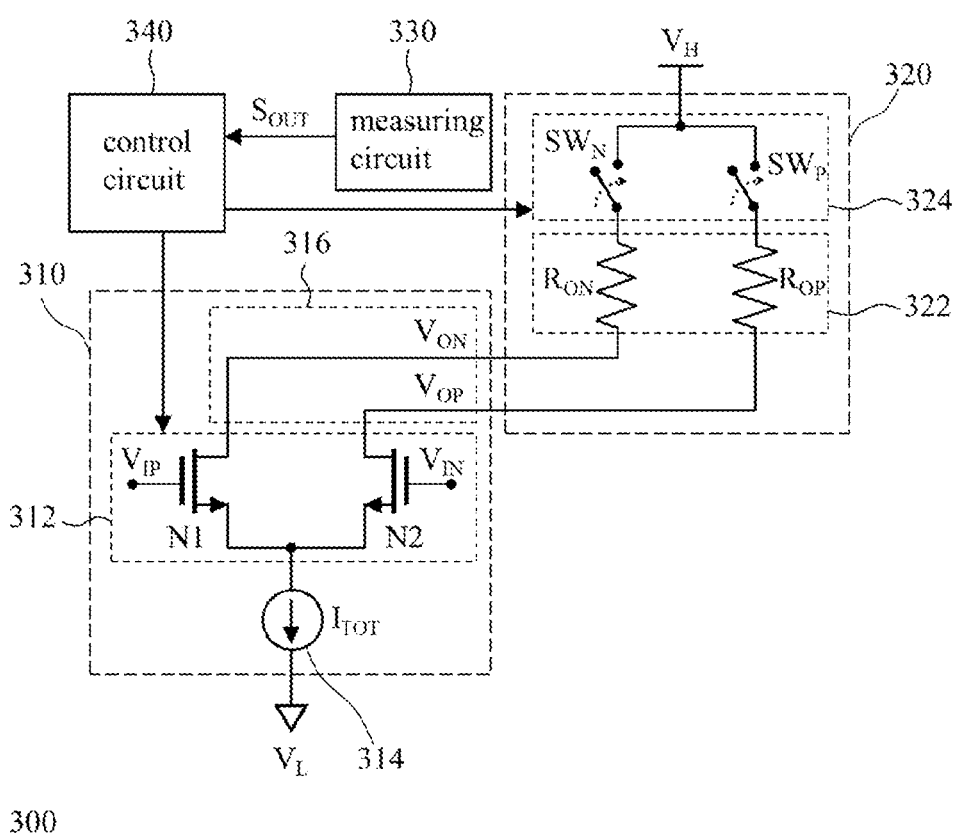
FIG. 4 shows an exemplary implementation of the test system of FIG. 3.

FIG. 4 shows an exemplary implementation of the test system 300 of FIG. 3. As shown in FIG. 4, the input signal $V_I$ is a differential input signal composed of two signals $V_{IP}$, $V_{IN}$; the output signal $V_O$ is a differential output signal $V_O$ composed of two signals $V_{OP}$, $V_{ON}$; the signal input circuit 312 includes a first transistor N1 and a second transistor N2 that are respectively used for receiving the input signal $V_{IP}$ and the input signal $V_{IN}$; the signal output wire circuit 316 includes a first wire circuit and a second wire circuit that are respectively used for outputting the output signal $V_{OP}$ and $V_{ON}$; and the impedance circuit 322 includes a first resistor $R_{OP}$ and a second resistor $R_{ON}$ that are respectively coupled to the first wire circuit and the second wire circuit of the signal output wire circuit 316. In addition, FIG. 4 also shows that the coupling circuit 324 includes a switch circuit coupled between the high power-supply terminal $V_H$ and the impedance circuit 322; the switch circuit includes a first switch $SW_P$ and a second switch $SW_N$; the first switch $SW_P$ is configured to electrically connect the high power-supply terminal $V_H$ with the second transistor N2; and the second switch $SW_N$ is configured to electrically connect the high power-supply terminal $V_H$ with the first transistor N1. The high power-supply terminal $V_H$, the first switch $SW_P$, the first resistor $R_{OP}$, the first wire circuit of the signal output wire circuit 316, the second transistor N2, the current source 314, and the low power-supply terminal $V_L$ form a first path. The high power-supply terminal $V_H$, the second switch $SW_N$, the second resistor $R_{ON}$, the second wire circuit of the signal output wire circuit 316, the first transistor N1, the current source 314, and the low power-supply terminal $V_L$ form a second path. On condition that the first switch $SW_P$ is turned on (i.e., conducting) and the second switch $SW_N$ is turned off (i.e., nonconducting), the measuring circuit 330 measures the target current/voltage of the first path; and on condition that the second switch $SW_N$ is turned on and the first switch $SW_P$ is turned off, the measuring circuit 330 measures the target current/voltage of the second path. It should be noted that during the aforementioned performance test, the first switch $SW_P$ and the second switch $SW_N$ are turned on concurrently so that a receiving circuit (e.g., the performance test unit 130 of FIG. 1) can receive and process the differential output signal $V_{ON}$, $V_{OP}$. It should also be noted that although both the first transistor N1 and the second transistor N2 in FIG. 4 are NMOS transistors, they can be replaced with other types of transistors, if practicable.

It should be noted that if the coupling circuit 324 is removed from the embodiment of FIG. 3 or suspended from operation (i.e., the switches $SW_P$, $SW_N$ of the coupling circuit 324 being always turned on), the test system 300 can function under every mode of the function test except the below-mentioned inter-path short-circuited test mode. Therefore, the coupling circuit 324 can optionally be omitted if the inter-path short-circuited test mode is not necessary.

Please refer to FIG. 4. During the function test, the control circuit 340 controls the states of the first switch $SW_P$ and the second switch $SW_N$ and determines the voltage levels of the input signal $V_{IP}$ and the input signal $V_{IN}$. For example, the function test includes: a first-path function test mode used for detecting open-circuited and short-circuited problems; a second-path function test mode used for detecting open-circuited and short-circuited problems; a first inter-path function test mode used for detecting one or more short-circuited problem(s); and a second inter-path function test mode used for detecting one or more short-circuited problem(s). Under the first-path function test mode, the control circuit 340 turns on the first switch $SW_P$ and the second transistor N2 and makes the measuring circuit 330 measure the target current/voltage of the aforementioned first path to find out whether the result of a first-path function test is normal; more specifically, if the result is normal, it indicates that the first path has neither open-circuited problems nor short-circuited problems. Under the second-path function test mode, the control circuit 340 turns on the second switch $SW_N$ and the first transistor N1 and makes the measuring circuit 330 measure the target current/voltage of the aforementioned second path to find out whether the result of a second-path function test is normal; more specifically, if the result is normal, it indicates that the second path has neither open-circuited problems nor short-circuited problems. Under the first inter-path function test mode, the control circuit 340 turns on the first switch $SW_P$ and the first transistor N1 and makes the measuring circuit 330 measure the target current/voltage to find out whether there is a current leaked from the first path to the second path and thereby ascertain whether the first path and the second path are short-circuited. Under the second inter-path function test mode, the control circuit 340 turns on the second switch $SW_N$ and the second transistor N2 and makes the measuring circuit 330 measure the target current/voltage to find out whether there is a current leaked from the second path to the first path and thereby ascertain whether the first path and the second path are short-circuited.

Figure 5:
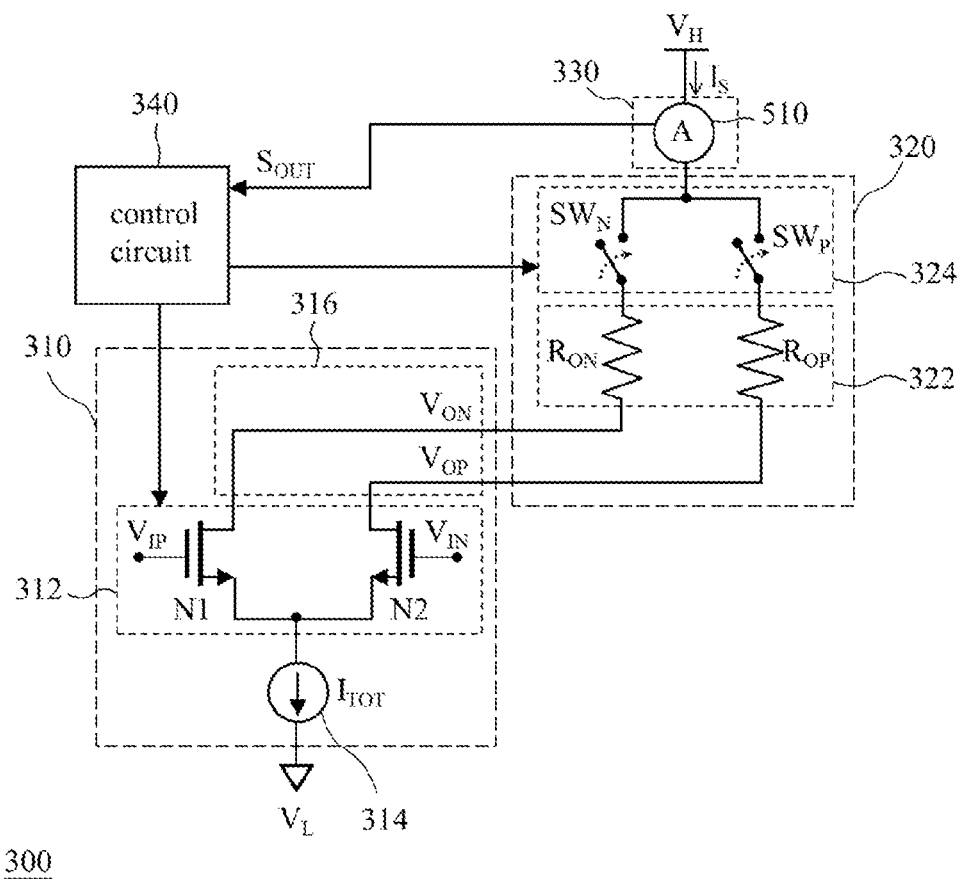
FIG. 5 shows an embodiment of the measuring circuit of FIG. 4.
Figure 6:
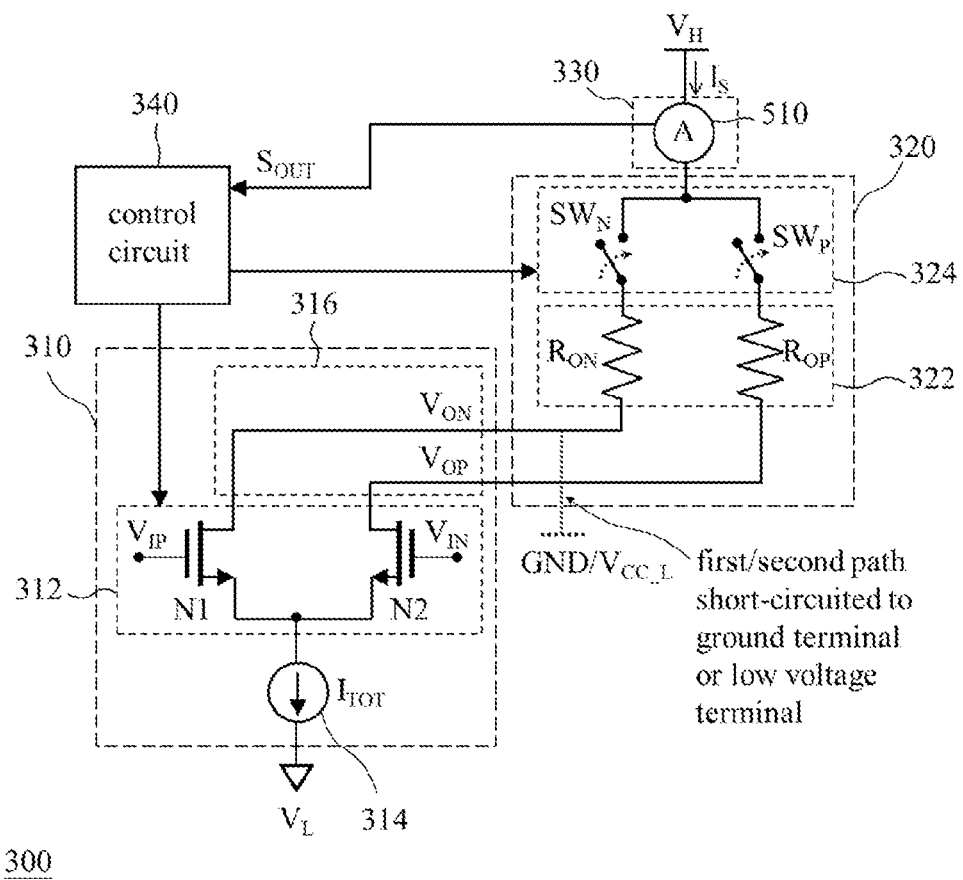
FIG. 6 shows that the first/second path of the device under test (DUT) of FIG. 5 is short-circuited to a ground terminal or a low voltage terminal.
Figure 7A:
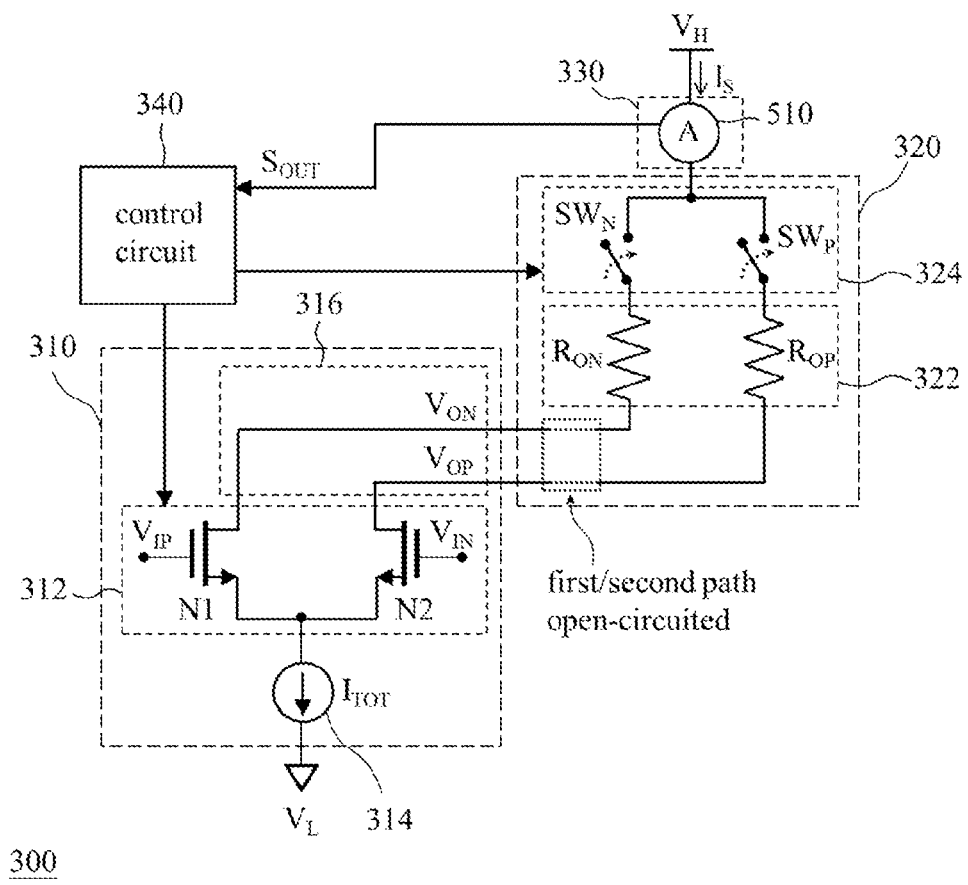
FIG. 7a shows that the first/second path of the DUT of FIG. 5 is open-circuited.
Figure 7B:
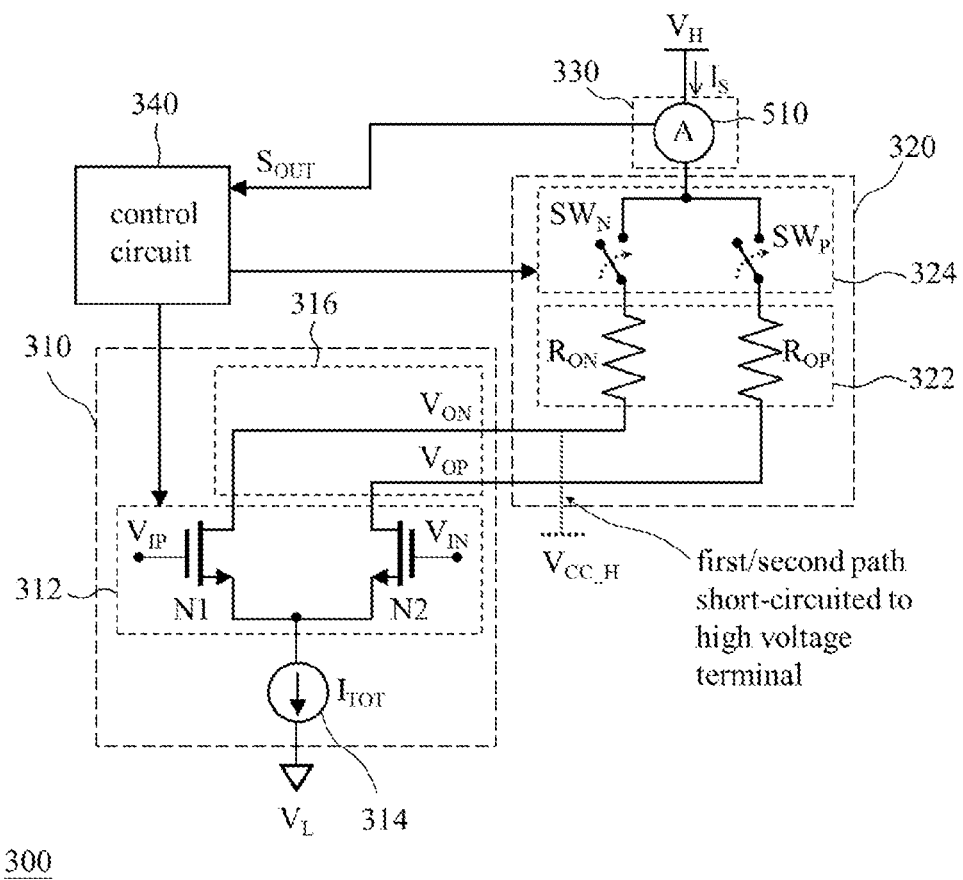
FIG. 7b shows that the first/second path of the DUT of FIG. 5 is short-circuited to a high voltage terminal.
Figure 8:
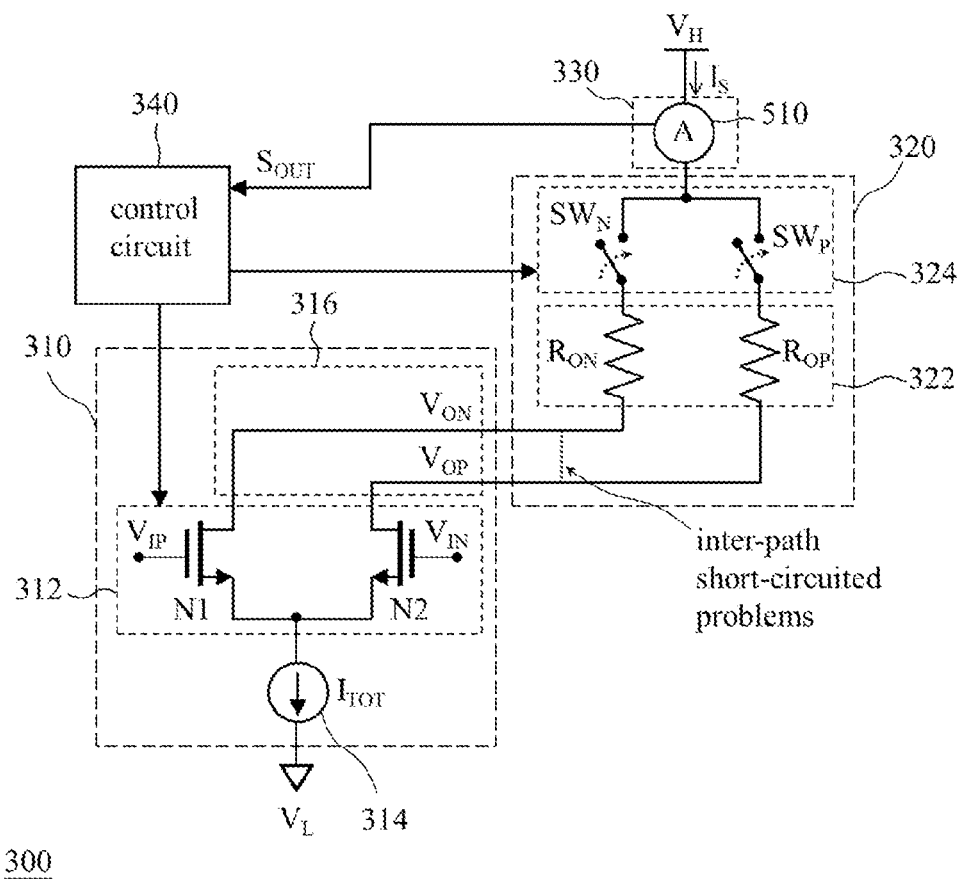
FIG. 8 shows that the first path and second path of the DUT of FIG. 5 are short-circuited.

FIG. 5 shows an embodiment of the measuring circuit 330 of FIG. 3. The measuring circuit 330 of FIG. 5 includes a current meter 510 that is coupled between the high power-supply terminal $V_H$ and the coupling circuit 324 and configured to measure the target current $I_S$. Please refer to Table 1 below; in an exemplary implementation under the aforementioned first-path/second-path function test mode (i.e., $1^{st}/2^{nd}$ mode in Table 1), the control circuit 340 determines that:

(1) the DUT is in a first-path/second-path normal condition if the measurement result $S_{OUT}$ indicates that a current difference between the target current $I_S$ and the total current $I_{TOT}$ is less than a current threshold, that is to say, the measurement result $S_{OUT}$ indicates that the target current $I_S$ is equal/similar to the total current $I_{TOT}$;

(2) the DUT is in a first-path/second-path short-circuited condition, which implies that the first/second path is short-circuited to a ground terminal (GND) or a low voltage terminal (e.g., a voltage terminal $V_{CC\_L}$ having a voltage lower than the voltage at the high power-supply terminal $V_H$) as shown in FIG. 6, if the measurement result $S_{OUT}$ indicates that the target current $I_S$ is greater than the total current; or (3) the DUT is in a first-path/second-path abnormal condition, which implies that the first/second path is open-circuited as shown in FIG. 7a or the first/second path is short-circuited to a high voltage terminal (e.g., a voltage terminal $V_{CC\_H}$ having a voltage higher than the voltage at the high power-supply terminal $V_H$) as shown in FIG. 7b, if the measurement result $S_{OUT}$ indicates that the target current $I_S$ is less than the total current $I_{TOT}$.

second path as shown in FIG. 8, if the measurement result $S_{OUT}$ indicates that a current difference between the target current $I_S$ and the total current $I_{TOT}$ is not greater than a current threshold, that is to say, the measurement result $S_{OUT}$ indicates that the target current $I_S$ is equal/similar to the total current $I_{TOT}$.

Figure 9:
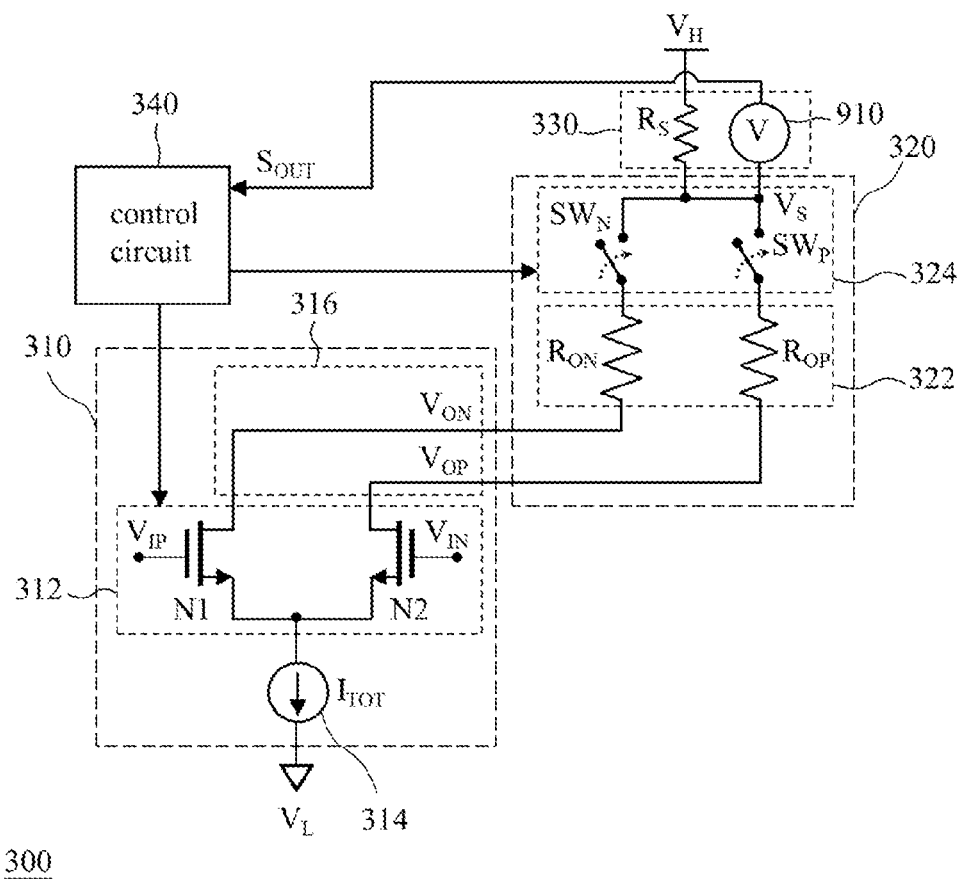
FIG. 9 shows another embodiment of the measuring circuit of FIG. 4.

FIG. 9 shows another embodiment of the measuring circuit 300 of FIG. 3. The measuring circuit 330 of FIG. 9 includes a resistor $R_S$ and a voltage meter 910. The resistor $R_S$ is coupled between the high power-supply terminal $V_H$ and the coupling circuit 324. The voltage meter 910 is configured to measure the target voltage $V_S$ at a node between the resistor $R_S$ and the coupling circuit 324; and on condition that the first/second path is in a normal condition

TABLE 1

| Mode | $V_{IP}$ | $V_{IN}$ | $SW_P$ | $SW_N$ | $I_S$ | Control circuit making decision according to $S_{OUT}$ |
|---|---|---|---|---|---|---|
| 1st mode | low | high | turned on | turned off | $I_S =/\approx I_{TOT}$ | first path having neither open-circuited problems nor short-circuited problems |
| | | | | | $I_S \gg I_{TOT}$ | first path being short-circuited to a ground terminal or a low voltage terminal |
| | | | | | $I_S \ll I_{TOT}$ | first path being open-circuited or short-circuited to a high voltage terminal |
| 2nd mode | high | low | turned off | turned on | $I_S =/\approx I_{TOT}$ | second path having neither open-circuited problems nor short-circuited problems |
| | | | | | $I_S \gg I_{TOT}$ | second path being short-circuited to a ground terminal or a low voltage terminal |
| | | | | | $I_S \ll I_{TOT}$ | second path being open-circuited or short-circuited to a high voltage terminal |
| 3rd mode | high | low | turned on | turned off | $I_S \ll I_{TOT}$ | inter-path short-circuited problem(s) being not found |
| | | | | | $I_S =/\approx I_{TOT}$ | inter-path short-circuited problem(s) being found |
| 4th mode | low | high | turned off | turned on | $I_S \ll I_{TOT}$ | inter-path short-circuited problem(s) being not found |
| | | | | | $I_S =/\approx I_{TOT}$ | inter-path short-circuited problem(s) being found |

Please refer to Table 1 again. Under the aforementioned first/second inter-path function test mode (i.e., 3rd/4th mode in Table 1), the control circuit 340 determines that:

(1) the DUT is in an inter-path normal condition without any detected inter-path short-circuited problems if the measurement result $S_{OUT}$ indicates that a current difference between the target current $I_S$ and the total current $I_{TOT}$ is greater than a current threshold, that is to say, the measurement result $S_{OUT}$ indicates that the target current $I_S$ is less than the total current $I_{TOT}$; or (2) the DUT is in an inter-path short-circuited condition, which implies that the first path is short-circuited to the without any detected open-circuited problems and any detected short-circuited problems, the target voltage $V_S$ (i.e., $V_S=V_{33}-I_{TOT}\times R_S=V_{OK}$) is equal/similar to the voltage $V_{33}$ of the high power-supply terminal $V_H$ minus the voltage drop across the resistor $R_S$ (i.e., $I_{TOT}\times R_S$). Table 2 shows the measurement result $S_{OUT}$ of the embodiment of FIG. 9 under every mode. Since those having ordinary skill in the art can appreciate the detail of the embodiment of FIG. 9 by referring to the embodiment of FIG. 5, repeated and redundant description is omitted here.

TABLE 2

| Mode | $V_{IP}$ | $V_{IN}$ | $SW_P$ | $SW_N$ | $V_S$ | Control circuit making decision according to $S_{OUT}$ |
|---|---|---|---|---|---|---|
| 1st mode | low | high | turned on | turned off | $V_S =/\approx V_{OK}$ | first path having neither open-circuited problems nor short-circuited problems |
| | | | | | $V_S \ll V_{OK}$ | first path being short-circuited to a ground terminal or a low voltage terminal |
| | | | | | $V_S \gg V_{OK}$ | first path being open-circuited or short-circuited to a high voltage terminal |
| 2nd mode | high | low | turned off | turned on | $V_S =/\approx V_{OK}$ | second path having neither open-circuited problems nor short-circuited problems |
| | | | | | $V_S \ll V_{OK}$ | second path being short-circuited to a ground terminal or a low voltage terminal |
| | | | | | $V_S \gg V_{OK}$ | second path being open-circuited or short-circuited to a high voltage terminal |
| 3rd mode | high | low | turned on | turned off | $V_S \gg V_{OK}$ | inter-path short-circuited problem(s) being not found |
| | | | | | $V_S =/\approx V_{OK}$ | inter-path short-circuited problem(s) being found |
| 4th mode | low | high | turned off | turned on | $V_S \gg V_{OK}$ | inter-path short-circuited problem(s) being not found |
| | | | | | $V_S =/\approx V_{OK}$ | inter-path short-circuited problem(s) being found |

It should be noted that the measurement result $S_{OUT}$ of Table 1 (i.e., the relation between $I_S$ and $I_{TOT}$) and the measurement result $S_{OUT}$ of Table 2 (i.e., the relation between $V_S$ and $V_{OK}$) can be obtained with a comparing circuit. The comparing circuit can be included in the measuring circuit 330, and in this instance the measurement result $S_{OUT}$ is the comparison result generated by the comparing circuit; or the comparing circuit can be included in the control circuit 340, and in this instance the measurement result $S_{OUT}$ is the target current/voltage (i.e., $I_S/V_S$). Since the comparing circuit can be a known or self-developed circuit, its detail is omitted here.

Figure 10:
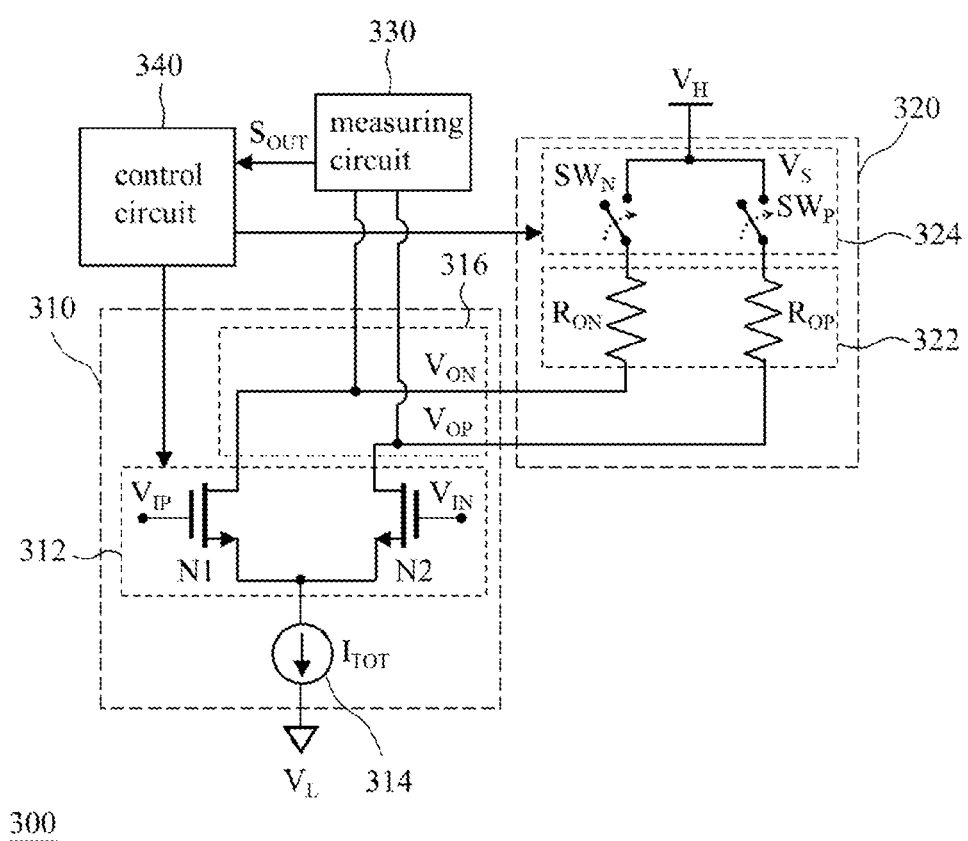
FIG. 10 shows yet another embodiment of the measuring circuit of FIG. 4.

FIG. 10 shows another embodiment of the measuring circuit 330 of FIG. 3. Compared with FIG. 9, the measuring circuit 330 of FIG. 10 directly measures the differential output signal $V_{ON}/V_{OP}$ and then the measuring circuit 330/control circuit 340 compares the measured voltage with a predetermined voltage to determine whether any open-circuited problem or short-circuited problem exist. Since those having ordinary skill in the art can appreciate the detail and modification of the embodiment of FIG. 10 by referring to the other embodiments, repeated and redundant description is omitted here.

Figure 11:
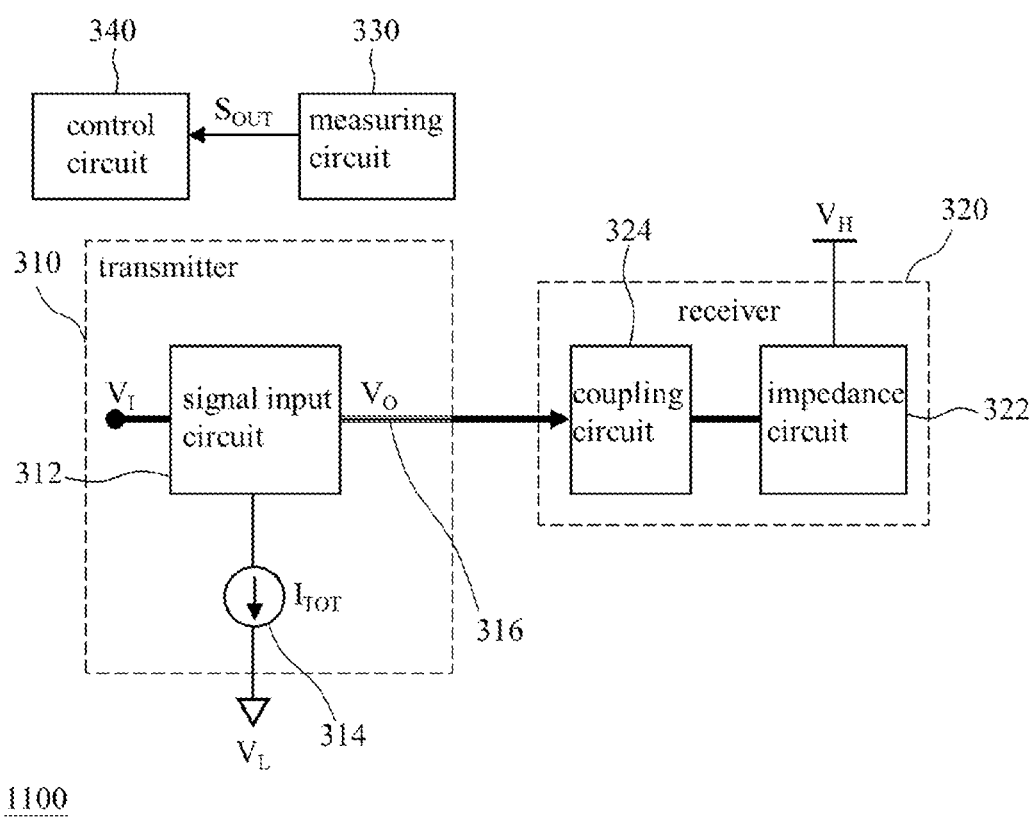
FIG. 11 shows another embodiment of the test system of the present disclosure.

FIG. 11 shows another embodiment of the test system of the present disclosure. Compared with FIG. 3, the coupling circuit 324 in the test system 1100 of FIG. 11 is used for coupling the signal output wire circuit 316 of the transmitter 310 to the impedance circuit 322 of the receiver 320. Although the coupling circuit 324 in FIG. 11 is set between the signal output wire circuit 316 and the impedance circuit 322, the coupling circuit 324 can be set between the signal input circuit 312 and the signal output wire circuit 316 instead. Generally, the coupling circuit 324 is set between a differential signal terminal (i.e., terminals of the signal output wire circuit 316 or terminals of the signal input circuit 312) and the impedance circuit 322. Since those having ordinary skill in the art can appreciate the detail and modification of the embodiment of FIG. 11 by referring to the embodiments of FIGS. 3-10, repeated and redundant description is omitted here.

The present disclosure also discloses a transmitter (e.g., the transmitter 310 in FIG. 3) and a receiver (e.g., the receiver 320 in FIG. 3) capable of executing multiple tests based on a DC coupling configuration. Since those having ordinary skill in the art can appreciate the detail and modification of the transmitter and the receiver by referring to the embodiments of FIGS. 3-11 and the exemplary implementations described in the preceding paragraphs, which means that the features of the embodiments of FIGS. 3-11 and the exemplary implementations can be applied to the transmitter and the receiver in a logical way, repeated and redundant description is omitted here.

It should be noted that people of ordinary skill in the art can selectively use some or all of the features of any embodiment in this specification or selectively use some or all of the features of multiple embodiments in this specification to implement the present invention as long as such implementation is practicable, which means that the way to realize the present invention can be flexible.

To sum up, the test system, transmitter, and receiver of the present disclosure can execute multiple tests based on a DC coupling configuration without using any multiplexer. Compared with the prior art, the present invention is not only simple in design but also cost-effective.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A test system capable of executing multiple tests based on a direct-current (DC) coupling configuration, comprising:
    a transmitter including:
        a signal input circuit configured to determine an output signal according to an input signal;
        a current source coupled between a first voltage terminal of the signal input circuit and a first power-supply terminal, and configured to determine a total current passing through the signal input circuit in a normal condition without any detected open-circuited problem and any detected short-circuited problem; and
        a signal output wire circuit coupled between a second voltage terminal of the signal input circuit and an impedance circuit, and configured to output the output signal that is a to-be-tested signal during a performance test, in which a voltage at the second voltage terminal is higher than a voltage at the first voltage terminal;
    a receiver coupled to the transmitter in a DC coupling manner, including:
        the impedance circuit coupled to a second power-supply terminal directly or indirectly, in which an impedance of the impedance circuit and the total current jointly determine strength of the output signal in the normal condition and a voltage at the second power-supply terminal is higher than a voltage at the first power-supply terminal;
    a measuring circuit configured to measure a target current or a target voltage between the second power-supply terminal and the first power-supply terminal and thereby generate a measurement result; and
    a control circuit configured to determine whether a device under test (DUT) is in the normal condition according to the measurement result during a function test that is used for detecting open-circuited and short-circuited problems, in which the DUT is one of the transmitter and the receiver.

2. The test system of claim 1, wherein under a single-path function test mode of the function test, the control circuit determines that the DUT is in a single-path normal condition without any detected single-path open-circuited problem and any detected single-path short-circuited problem if a current difference between the target current and the total current is less than a current threshold or a voltage difference between the target voltage and a predetermined voltage is lower than a voltage threshold.

3. The test system of claim 1, wherein under an inter-path short-circuited test mode of the function test, the control circuit determines that the DUT is in an inter-path normal condition without any detected inter-path short-circuited problem if a current difference between the target current and the total current is greater than a current threshold or a voltage difference between the target voltage and a predetermined voltage is higher than a voltage threshold.

4. The test system of claim 1, further comprising: a coupling circuit configured to couple the impedance circuit to the second power-supply terminal or couple the signal input circuit to the impedance circuit.

5. The test system of claim 4, wherein the input signal is a differential input signal, the output signal is a differential output signal, the signal input circuit includes a first transistor and a second transistor, the first transistor and the second transistor are configured to receive a first input signal of the differential input signal and a second input signal of the differential input signal respectively, and the coupling circuit further includes:
    a switch circuit being coupled between the second power-supply terminal and the impedance circuit and including a first switch and a second switch, in which the first switch is configured to electrically connect the second power-supply terminal with the second transistor, the second switch is configured to electrically connect the second power-supply terminal with the first transistor, and while the measuring circuit measures the target current or the target voltage, the first switch and the second switch are not turned on concurrently.

6. The test system of claim 5, wherein the signal output wire circuit includes a first wire circuit and a second wire circuit; the impedance circuit includes a first resistor and a second resistor; a first path is formed with the second power-supply terminal, the first switch, the first resistor, the first wire circuit, the second transistor, the current source, and the first power-supply terminal; a second path is formed with the second power-supply terminal, the second switch, the second resistor, the second wire circuit, the first transistor, the current source, and the first power-supply terminal; while the first switch is turned on, the measuring circuit measures the target current or the target voltage of the first path; while the second switch is turned on, the measuring circuit measures the target current or the target voltage of the second path.

7. The test system of claim 6, wherein the control circuit is configured to control states of the first switch and the second switch and determine voltage levels of the first input signal and the second input signal during the function test.

8. The test system of claim 5, wherein the first switch and the second switch are turned on concurrently during the performance test.

9. The test system of claim 4, wherein the measuring circuit includes a current meter that is coupled between the second power-supply terminal and the coupling circuit and configured to measure the target current.

10. The test system of claim 4, wherein the measuring circuit includes a resistor and a voltage meter, the resistor is coupled between the second power-supply terminal and the coupling circuit, and the voltage meter is configured to measure the target voltage at a node between the resistor and the coupling circuit.

11. A transmitter capable of executing multiple tests based on a direct-current (DC) coupling configuration, comprising:
    a differential signal input circuit including:
        a first transistor configured to determine a second output signal of a differential output signal according to a first input signal of a differential input signal; and
        a second transistor configured to determine a first output signal of the differential output signal according to a second input signal of the differential input signal, in which a voltage level of the first input signal is different from a voltage level of the second input signal during a function test that is used for detecting open-circuited and short-circuited problems;
    a current source coupled between a first voltage terminal of the differential signal input circuit and a first power-supply terminal, and configured to determine a total current passing through the differential signal input circuit in a normal condition without any detected open-circuited problem and any detected short-circuited problem; and a differential signal output wire circuit coupled with high voltage terminals of the first transistor and the second transistor, and configured to output the differential output signal that is a to-be-tested signal during a performance test, wherein during the function test, the voltage level of the first input signal and the voltage level of the second input signal are respectively dependent on a state of a second switch and a state of a first switch, the state of the second switch allows or forbids the total current to pass through the first transistor, the state of the first switch allows or forbids the total current to pass through the second transistor, and the state of the first switch is different from the state of the second switch.

12. The transmitter of claim 11, wherein the function test includes at least one of the following modes:
a first-path function test mode used for detecting open-circuited and short-circuited problems in a circumstance that the voltage level of the first input signal turns off the first transistor, the voltage level of the second input signal turns on the second transistor, the first switch is turned on, and the second switch is turned off;
a second-path function test mode used for detecting open-circuited and short-circuited problems in a circumstance that the voltage level of the first input signal turns on the first transistor, the voltage level of the second input signal turns off the second transistor, the first switch is turned off, and the second switch is turned on;
a first inter-path function test mode used for detecting one or more short-circuited problem(s) in a circumstance that the voltage level of the first input signal turns on the first transistor, the voltage level of the second input signal turns off the second transistor, the first switch is turned on, and the second switch is turned off; and
a second inter-path function test mode used for detecting one or more short-circuited problem(s) in a circumstance that the voltage level of the first input signal turns off the first transistor, the voltage level of the second input signal turns on the second transistor, the first switch is turned off, and the second switch is turned on.

13. The transmitter of claim 11, wherein the first switch and the second switch are turned on concurrently during the performance test.

14. The transmitter of claim 11, wherein the transmitter is coupled to a receiver without any intervening multiplexer.

15. The transmitter of claim 11, wherein the transmitter is an HDMI transmitter.

16. A receiver capable of executing multiple tests based on a direct-current (DC) coupling configuration, comprising:
an impedance circuit including:
a first impedance coupled to a first output terminal used for outputting a first output signal of a differential output signal, in which the first output signal of the differential output signal is dependent on a second input signal of a differential input signal; and
a second impedance coupled to a second output terminal used for outputting a second output signal of the differential output signal, in which the second output signal of the differential output signal is dependent on a first input signal of the differential input signal, the impedance circuit is configured to determine strength of the differential output signal according to a total current in a normal condition without any detected open-circuited problem and any detected short-circuited problem, and the differential output signal is a to-be-tested signal during a performance test; and a switch circuit configured to couple the impedance circuit to a power-supply terminal or couple a differential signal output terminal to the impedance circuit, the switch circuit including a first switch and a second switch, the differential signal output terminal including the first output terminal and the second output terminal, the first switch being coupled between the power-supply terminal and the first impedance or coupled between the first impedance and the first output terminal, and the second switch being coupled between the power-supply terminal and the second impedance or coupled between the second impedance and the second output terminal, wherein during a function test used for detecting open-circuited and short-circuited problems, the voltage level of the first input signal and the voltage level of the second input signal relate to a state of the second switch and a state of the first switch respectively, and the state of the first switch is different from the state of the second switch.

17. The receiver of claim 16, wherein the function test includes at least one of the following modes:
a first-path function test mode used for detecting open-circuited and short-circuited problems in a circumstance that the voltage level of the first input signal turns off the first transistor, the voltage level of the second input signal turns on the second transistor, the first switch is turned on, and the second switch is turned off;
a second-path function test mode used for detecting open-circuited and short-circuited problems in a circumstance that the voltage level of the first input signal turns on the first transistor, the voltage level of the second input signal turns off the second transistor, the first switch is turned off, and the second switch is turned on;
a first inter-path function test mode used for detecting one or more short-circuited problem(s) in a circumstance that the voltage level of the first input signal turns on the first transistor, the voltage level of the second input signal turns off the second transistor, the first switch is turned on, and the second switch is turned off; and
a second inter-path function test mode used for detecting one or more short-circuited problem(s) in a circumstance that the voltage level of the first input signal turns off the first transistor, the voltage level of the second input signal turns on the second transistor, the first switch is turned off, and the second switch is turned on.

18. The receiver of claim 16, wherein the first switch and the second switch are turned on concurrently during the performance test.

19. The receiver of claim 16, wherein the receiver is coupled to a transmitter without any intervening multiplexer.

20. The receiver of claim 16, wherein the receiver is an HDMI receiver.

* * * * *